United States Patent
Kuhn et al.

(10) Patent No.: US 6,723,166 B2
(45) Date of Patent: Apr. 20, 2004

(54) SEED CRYSTAL HOLDER WITH LATERAL MOUNT FOR AN SIC SEED CRYSTAL

(75) Inventors: Harald Kuhn, Erlangen (DE); Rene Stein, Roettenbach (DE); Johannes Voelkl, Erlangen (DE); Wolfgang Zintl, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 267 days.

(21) Appl. No.: 10/042,099

(22) Filed: Jan. 7, 2002

(65) Prior Publication Data

US 2002/0088391 A1 Jul. 11, 2002

Related U.S. Application Data

(63) Continuation of application No. PCT/DE00/02171, filed on Jul. 4, 2000.

(30) Foreign Application Priority Data

Jul. 7, 1999 (DE) .......................... 199 31 336

(51) Int. Cl.⁷ .............................................. C30B 35/00
(52) U.S. Cl. ..................... 117/200; 117/202; 117/900
(58) Field of Search .................. 117/200, 900, 117/202

(56) References Cited

U.S. PATENT DOCUMENTS

| | | | |
|---|---|---|---|
| 5,679,153 A | 10/1997 | Dmitriev et al. | |
| 5,858,086 A | 1/1999 | Hunter | |
| 6,045,613 A | 4/2000 | Hunter | |
| 6,056,820 A * | 5/2000 | Balakrishna et al. | 117/200 |
| 6,508,880 B2 * | 1/2003 | Vodakov et al. | 117/202 |
| 6,537,371 B2 * | 3/2003 | Vodakov et al. | 117/105 |
| 6,547,877 B2 * | 4/2003 | Vodakov et al. | 117/105 |

FOREIGN PATENT DOCUMENTS

| | | |
|---|---|---|
| DE | 32 30 727 | 2/1987 |
| DE | 196 22 402 C2 | 10/1997 |
| EP | 0 801 155 A1 | 10/1997 |
| JP | 1305898 | 12/1984 |
| JP | 62-123093 A | 6/1987 |
| JP | 2-30699 A | 2/1990 |
| JP | 3-187994 A | 8/1991 |
| JP | 08245299 | 9/1996 |
| WO | 94/23096 | 10/1994 |
| WO | 97/07265 | 2/1997 |
| WO | 00/22203 | 4/2000 |

OTHER PUBLICATIONS

Römpp Chermie Lexikon, 9ᵗʰ. Edition 1995, vol. 6, entry: Tantal, Tantal alloys, pp. 4453–4455.
Garcon et al: "Study of single–crystal sublimation growth conditions" Materials Science and Engineering. Vol. B29, 1995, pp. 90–93.

* cited by examiner

Primary Examiner—Robert Kunemund
Assistant Examiner—Matthew Anderson
(74) Attorney, Agent, or Firm—Laurence A. Greenberg; Werner H. Stemer; Ralph E. Locher

(57) ABSTRACT

A seed crystal holder holds a SiC seed crystal while a SiC bulk single crystal is grown on the front surface of the seed crystal. The holder includes a back surface body with a bearing surface for bearing against a back surface of the SiC seed crystal. The holder includes a lateral mount for receiving the back surface body and the SiC seed crystal. The lateral mount has a projection located on an end facing the SiC seed crystal. The SiC seed crystal rests on the projection.

12 Claims, 2 Drawing Sheets

SEED CRYSTAL HOLDER WITH LATERAL MOUNT FOR AN SIC SEED CRYSTAL

CROSS-REFERENCE TO RELATED APPLICATION

This application is a continuation of copending International Application No. PCT/DE00/02171, filed Jul. 4, 2000, which designated the United States.

BACKGROUND OF THE INVENTION

Field of the Invention

The invention relates to a seed crystal holder for holding a silicon carbide (SiC) seed crystal inside a crucible while an SiC bulk single crystal is grown onto the front surface of the SIC seed crystal. The crystal is grown using a sublimation method.

Currently, two forms of crucibles having fundamentally different designs are used for growing silicon carbide in single crystal form using sublimation. Using a first crucible design, a stock of solid silicon carbide that is to be sublimed is situated in an upper region of the crucible and the SIC seed crystal is situated in a lower crucible region. The silicon carbide that is sublimed from the stock grows in the form of an SIC bulk single crystal on the SIC seed crystal. A first crucible design of this type is disclosed, for example, in Issued German Patent DE 32 30 727 C2. Since the SiC seed crystal can simply rest on the base of crucible, there is no need for any specially designed seed crystal holder. However, in this crucible design, there is a risk of a solid SiC particle, for example from the stock, dropping onto the growing SiC bulk single crystal and disturbing the crystal growth.

In contrast, Published International Patent Application WO 94/23096 A1 and also the article Materials Science and Engineering, Vol. B29, 1995, pages 90 to 93 describe a second crucible design that avoids this drawback by arranging the SiC seed crystal in the upper region of the crucible and the SiC stock in the lower region of the crucible. However, there are no precise details as to how to attach the SiC seed crystal of this type in the upper region of the crucible in a suspended manner.

A further seed crystal holder for holding an SiC seed crystal in a suspended position is described in Japanese Patent Application JP 02-030699 A.

Published International Patent Application WO 97/07265 A1 discloses a coating for the SiC seed crystal that is chemically stable with respect to the material of the SiC seed crystal and with respect to the SiC vapor phase formed form the sublimed SiC of the stock. Furthermore, this coating does not melt or sublime even at a temperature of over 2000° C., which prevails during the growth. In addition, this coating is also suitable for a suspended arrangement of the SiC seed crystal. This is because the SiC seed crystal is adhesively bonded to the seed crystal holder, using a sugar solution. However, since a sugar solution of this type has relatively poor thermal coupling to the seed crystal holder, there is the risk that an undesirable temperature gradient will be established within the SiC seed crystal, thus resulting in disruption of the crystal growth.

In U.S. Pat. No. 5,679,153, an SiC substrate, which is situated in a holder, is immersed from above into a melt that contains, inter alia, silicon carbide and pure silicon. The disclosed process is not a process for growing an SiC bulk single crystal, but rather is a liquid-phase epitaxy (LPE) process, in which only a thin epitaxial SiC layer is produced on an SiC substrate. Since, during a sublimation process for producing an SiC bulk single crystal, the SiC seed crystal is not immersed into a melt, and moreover, since the demands with regard to thermally coupling the SiC seed crystal to the holder are fundamentally different from those imposed in an LPE process, the holder disclosed in this patent cannot be used in a sublimation process for producing an SiC bulk single crystal.

Even clamping the SiC bulk single crystal to suspend the crystal inside the crucible, which is usually made from graphite, may lead to difficulties with obtaining a long-term connection in such a clamped arrangement because of the very low coefficient of thermal expansion of SiC, of $3 \cdot 10^{-6}$ $K^{-1}$. Since the graphite of the crucible has a higher expansion coefficient, the possibility exists that the clamped SiC seed crystal may become detached from the holder and drop down. However, even if the SiC seed crystal only slips slightly in the clamped holder, the crystal growth may be impaired as a result.

SUMMARY OF THE INVENTION

It is accordingly an object of the invention to provide a seed crystal holder, which overcomes the above-mentioned disadvantages of the prior art apparatus of this general type.

It is an object of the invention to provide a seed crystal holder for holding an SiC seed crystal inside a crucible while growing an SiC bulk single crystal on the front surface of the SiC seed crystal. This holder ensures that the SiC seed crystal is held securely and that there is good thermal coupling with the SiC seed crystal that is being held. Moreover, the seed crystal holder is suitable for growing a low-defect, high-quality SiC bulk single crystal. In particular, the seed crystal holder is also suitable for attaching the SiC seed crystal in a suspended position.

With the foregoing and other objects in view there is provided, in accordance with the invention, a seed crystal holder for holding a SiC seed crystal inside a crucible while growing a SiC bulk single crystal onto a front surface of the SiC seed crystal. The seed crystal holder includes: a back-surface body having a bearing surface for bearing against a back surface of the SiC seed crystal; and a lateral mount cooperating with the back-surface body. The lateral mount can be attached to the back-surface body. The lateral mount includes at least one projection providing a resting place for the edge region of the front surface of the SiC seed crystal. The lateral mount has a layer made from either tantalum, tungsten, niobium, molybdenum, rhenium, iridium, ruthenium, hafnium, or zirconium. Alternatively, the layer can be made from a material that includes tantalum, tungsten, niobium, molybdenum, rhenium, iridium, ruthenium, hafnium, and/or zirconium.

The invention is based on the discovery that a seed crystal holder, which is suitable for growing an SiC bulk single crystal, should ensure good thermal coupling with the back surface of the SiC seed crystal as well as ensure sufficient mechanical fixing. The SiC crystal, in particular, is in the form of a disk. The thermal coupling results from the back-surface body that is provided and that is in contact with the back surface of the SiC seed crystal. Since it does not fulfill any mechanical holding function, the back-surface body can be designed exclusively for achieving good thermal coupling with the SiC seed crystal. In particular, the back-surface body has a heat-dissipating action, i.e. it ensures that sufficient heat is dissipated from the SiC seed crystal and the SiC bulk single crystal growing thereon.

In contrast, the lateral mount mechanically fixes the SiC seed crystal. The SiC seed crystal rests on the projection of the lateral mount so that the SiC seed crystal can be fixed securely in the upper region of the crucible. The geometric dimensions of the lateral mount and of the back-surface body are matched to the SiC seed crystal that will be held such that the back-surface body is in contact with the SiC seed crystal. The back-surface body may, for example, simply rest on the SiC seed crystal, although it is also possible, by suitably selecting the geometric dimensions, to establish a predetermined contact pressure between the SiC seed crystal and the back-surface body. In any event, good thermal coupling of the SiC seed crystal to the back-surface body is ensured.

The projection of the mount can hold the SiC seed crystal either on the front surface, in an edge region, or on an edge shoulder that has been ground into the SiC seed crystal. The lateral mount runs substantially parallel to the direction of thickness of the SiC seed crystal and therefore also substantially parallel to the direction of growth of the SiC bulk single crystal.

To be able to fit the SiC seed crystal into the seed crystal holder, the holder can be taken apart and reassembled, i.e. it includes at least two elements that are mechanically independent of one another. In one embodiment, the back-surface body and the lateral mount are designed as separate components. First of all, the SiC bulk single crystal is placed into the lateral mount, so that its front surface is openly accessible apart from the region that is covered by the projection. The SiC bulk single crystal grows on this openly accessible region during the growth. Secondly, the back-surface contact is placed onto the back surface of the SiC seed crystal, and the lateral mount is fitted to the upper wall of the crucible.

However, in another embodiment, it is also possible for the seed crystal holder to include at least two half-shell elements that can be assembled and into which the SiC seed crystal can be inserted. In this embodiment, the lateral mount and the back-surface contact are present, although not as separate components, but rather as matching functional elements.

The grown SiC bulk single crystal typically has a length of at least 1 mm, preferably at least 5 mm. It is preferable to grow an SiC bulk single crystal which is as large as possible.

In accordance with an added feature of the invention, there is provided an embodiment in which the projection of the lateral mount has a first bevel. The first bevel is situated on the side of the projection that is remote from the SiC seed crystal. A wall thickness of the projection decreases to an increasing extent toward the center of the SiC seed crystal that will be held and ends in an acute angle. A first bevel of this type prevents the growing SiC bulk single crystal from growing into the material of the projection. This is also highly advantageous because the cross-sectional area of the SiC bulk single crystal usually increases slightly as the duration of the growth increases. Consequently, the SiC bulk single crystal is easier to remove from the seed crystal holder after the growth has concluded.

In accordance with an additional feature of the invention, there is provided another embodiment, in which the projection has a second bevel on the side facing the SiC seed crystal. If the SiC seed crystal is then also ground with a complementary third bevel, the result is that the SiC seed crystal is particularly securely seated in the seed crystal holder. It is also advantageous if the SiC seed crystal is ground such that the surface of the SiC seed crystal, on which the SiC bulk single crystal grows, projects slightly beyond the lower edge of the lateral mount. This can be achieved either by using a corresponding third bevel or with an edge shoulder produced on the SiC seed crystal.

In accordance with another feature of the invention, graphite is provided as the principle material that is used for the lateral mount and for the back-surface body. Graphite is a material that can withstand very high temperatures and is therefore also eminently suitable for use at the high process temperature involved when growing silicon carbide in a single crystal form using sublimation. In particular, the graphite may be high-purity electrographite.

In accordance with a further feature of the invention, the back-surface body is provided with a heat-resistant layer on which the SiC seed crystal rests. This layer consists of a material that is chemically stable with respect to the material of the SIC seed crystal and the components of the SIC vapor phase and does not melt or sublime at the process temperature used. The layer may consist of a material selected from the group consisting of tantalum, tungsten, niobium, molybdenum, rhenium, iridium, ruthenium, hafnium and zirconium or may contain at least one material from this group. In particular, the layer may also contain a carbide of one of the abovementioned high-melting materials.

A layer of this type, which is at least located on the bearing surface of the back-surface body prevents thermal decomposition (degradation of the SiC seed crystal) on the back surface of the SiC seed crystal, which is remote from the growth surface of the SiC seed crystal. Thermal degradation of this type may cause a defect, which was originally present only on the back surface of the SiC seed crystal, to propagate through the entire SiC seed crystal into the growing SiC bulk single crystal, where it impairs the quality of the grown SiC bulk single crystal. In particular, the layer prevents silicon from diffusing out of the SiC seed crystal into the seed crystal holder and also prevents a chemical reaction of the silicon from the SiC seed crystal with the material of the seed crystal holder. The layer may be designed as a suitable coating of the back-surface body or also as a loose inlay between the back-surface body and the SiC seed crystal, e.g. in the form of a foil.

In accordance with a further added feature of the invention, a layer of a chemically stable, high-melting material is provided, not only on the bearing surface of the back-surface body, but also on all of the contact surfaces between the seed crystal holder and the SiC seed crystal, i.e. also on the lateral mount. Therefore, there is no thermal degradation of the SiC seed crystal on any contact surface, so that the quality of the grown SiC bulk single crystal cannot be impaired by this effect.

Alternatively, the SiC seed crystal may also be provided with a layer of this type. There is then no need for the back-surface body and lateral mount to be coated.

In accordance with a further additional feature of the invention, the seed crystal holder has a substantially round cross-sectional geometry. This applies in particular also to the back-surface body and to the lateral mount. One reason for this geometrical shape is the fact that the cross-sectional area of the SiC seed crystal is likewise usually round. The lateral mount may adopt a cylindrical form having an interior into which, the SiC seed crystal and the back-surface body can be placed. The projection at the lower end of the lateral mount is then in the form of an annular diaphragm.

In accordance with yet an added feature of the invention, there is provided another embodiment, in which the back-surface body and the disk-like SiC seed crystal, which both have a round cross section, are held by a lateral mount in the form of two webs. In this embodiment, the projection is defined by a respective lug that is configured at the lower end of each of the two webs, and the SiC seed crystal rests on the lugs.

A further advantageous configuration relates to holding a misaligned SiC seed crystal. A specifically predetermined misalignment of this type results in steps with a substantially parallel orientation and a main step direction being formed on the surface of the SiC seed crystal.

At the beginning of the crystal growth, the grown silicon carbide in single crystal form initially accumulates in the step notches of the misaligned seed crystal surface. The steps then appear to move or flow. In this context, the term "step flow", which takes place practically perpendicular to the main step direction, is also used. It has been discovered that a large proportion of the defects that occur during crystal growth originate from the holder, and from there, grow into the SiC bulk single crystal preferentially in the direction of step flow. Therefore, it is advantageous for a misaligned SiC seed crystal with a front surface that is structured in step form to be held using the two webs such that a connecting line between the two webs runs substantially parallel (=longitudinally) with respect to the main step direction, i.e. substantially perpendicular to the direction of step flow. In this embodiment, action lines of the two webs run parallel. In this way, the lateral growth of defects into the SiC bulk single crystal is considerably reduced.

A further reduction in this type of defect formation is achieved, in another advantageous embodiment, by the fact that action lines of the two webs do not run parallel, but rather run at an obtuse angle with respect to each other. The obtuse angle formed by the action lines in this case preferably adopt a value that is less than 180° and greater than 100°.

In practice, the individual steps will not run precisely parallel to one another and will also not each have the same width. However, it is possible to specify mean values for the orientation of the steps and for their width. These mean values are referred to by the terms main step direction and main step width.

Other features which are considered as characteristic for the invention are set forth in the appended claims.

Although the invention is illustrated and described herein as embodied in a seed crystal holder with lateral mount for an SiC seed crystal, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
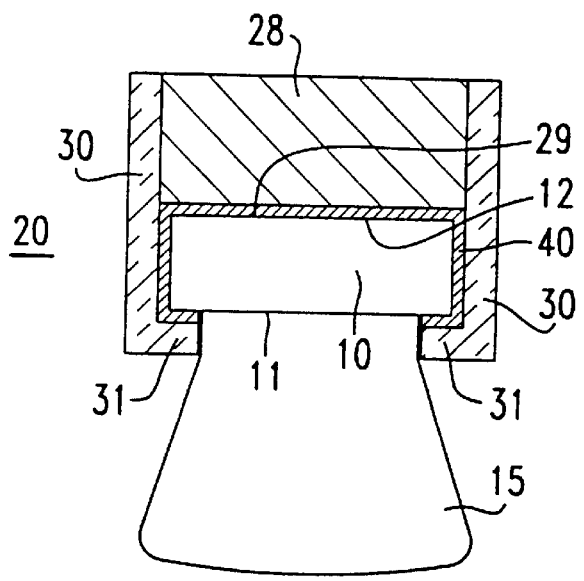
FIG. 1 shows a first embodiment of a seed crystal holder.

Referring now to the figures of the drawing in detail and first, particularly, to FIG. 1 thereof, there is shown a sectional illustration of a first seed crystal holder 20 that can be used during the sublimation growth of an SiC bulk single crystal 15. The seed crystal holder 20 is used to mechanically fix an SiC seed crystal 10 in an upper region, in particular, on an upper wall of a growth crucible (not shown). The SiC bulk single crystal 15 grows on the front surface 11 of the SiC seed crystal 10.

A back-surface body 28 made from graphite is arranged adjacent to a back surface 12 of the SiC seed crystal 10, which is remote from the front surface 11 of the Sic seed crystal 10. The back-surface body 28 ensures good thermal coupling of the SiC seed crystal 10 to the crucible (not shown). As a result, there is no undesirable heat gradient formed within the Sic seed crystal 10, which could otherwise lead to a deterioration in the quality of crystal grown.

Both the back-surface body 28 and the SiC seed crystal 10 are mechanically fixed to the upper crucible wall (not shown) by a lateral mount 30. The mount 30 has at least one projection 31 at its lower end. The edge region of the front surface 11 of the SiC seed crystal 10 rests on this projection 31. The mount 30 also consists of graphite.

To avoid thermal degradation of the SiC seed crystal 10, there is a layer 40 of tantalum between the bearing surface 29 of the back-surface body 28 and the SiC seed crystal 10 and between the lateral mount 30 and the SiC seed crystal 10. In the exemplary embodiment shown in FIG. 1, the layer 40 is a loosely inlaid tantalum foil with a thickness of approximately 50 μm. In particular, it prevents silicon from diffusing out of the SiC seed crystal 10 into the graphite of the seed crystal holder 20. This is because the tantalum of the layer 40 is chemically stable with respect to the aggressive SiC vapor phase and also with respect to the material of the SiC seed crystal, so that there are no undesirable chemical reactions that have an adverse effect on the quality of growth.

The SiC seed crystal 10 is held by the projection 31 of the lateral mount 30 to securely fix the SiC seed crystal 10 in the upper region of the growth crucible (not shown). This creates the right conditions for a particularly favorable suspended arrangement of the SiC seed crystal 10 in the growth crucible for achieving a high-quality crystal growth.

Figure 2:
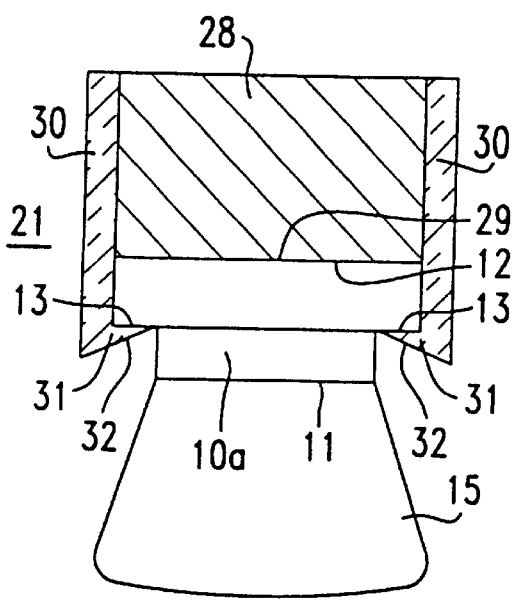
FIG. 2 shows a second embodiment of a seed crystal holder.

FIG. 2 shows a second embodiment of a seed crystal holder 21 for holding an SiC seed crystal 10a. The seed crystal holder 21 differs from the seed crystal holder 20 shown in FIG. 1 substantially only with regard to the shape of the projection 31. The projection 31 has a first bevel 32 on the side that is remote from the contact surface with the SiC seed crystal 10a. The wall thickness of the projection 32 becomes greater as the distance from the center of the SiC seed crystal 10a increases. In this exemplary embodiment, the projection 31 ends in an acute angle.

The SiC seed crystal 10a, which is fixed by the seed crystal holder 21, also differs slightly from the SiC seed crystal 10 shown in FIG. 1. The SiC seed crystal 10a has an edge shoulder 13 that rests on the projection 31, however, the front surface 11 of the SiC seed crystal 10a projects slightly beyond the lower edge of the lateral mount 30. Both the first bevel 32 and the edge shoulder 13 therefore prevent the SiC bulk single crystal 15 from growing onto the lateral mount 30 in the region of the projection 31. Since the cross-sectional area of the SiC bulk single crystal 15 increases slightly during growth, the shape of the first bevel 32 shown in FIG. 2 is particularly advantageous to reliably prevent the SiC bulk single crystal from growing on the lateral mount 30.

Figure 3:
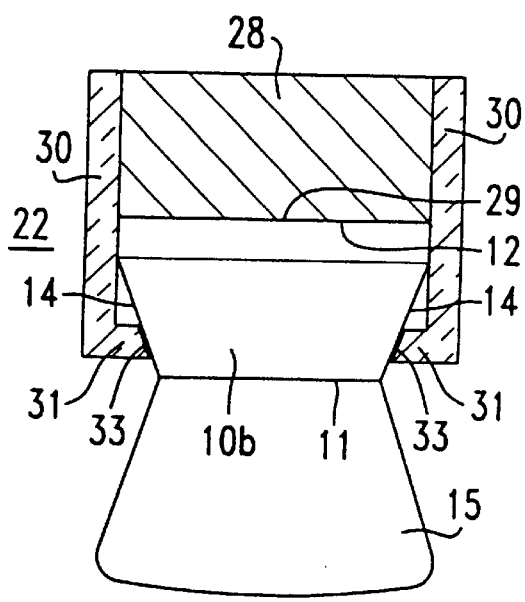
FIG. 3 shows a third embodiment of a seed crystal holder.

FIG. 3 shows a third embodiment of a seed crystal holder 22 for mechanically fixing an Sic seed crystal 10b. In this exemplary embodiment, both the projection 31 of the lateral mount 10 and the SiC seed crystal lob have second and third bevels 33 and 14, respectively, which are matched to one another. The result is that the SiC seed crystal 10b is seated particularly well in the seed crystal holder 22.

Figure 4:
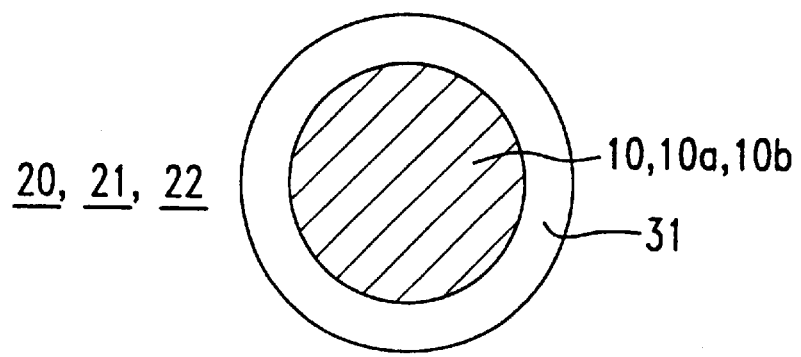
FIG. 4 is a view, from below, of the seed crystal holders shown in FIGS. 1 to 3.

FIG. 4 shows a view, from below, of the seed crystal holders 20 to 22 shown in FIGS. 1 to 3. All three of the seed crystal holders 20, 21 and 22 have a round cross-sectional geometry with, in particular, a cylindrical configuration. This round geometrical shape is imposed by the round disk shape of the SiC seed crystals 10, 10a and 10b that will be held. In all three of the seed crystal holders 20, 21 and 22, the projection 31 forms an annular diaphragm with a bearing surface running all the way around for the corresponding SiC seed crystal 10, 10a and 10b, respectively.

In the case of a misaligned seed crystal, the surface of which has a step-like structure, an annular diaphragm running all the way around of this misaligned seed crystal may promote the formation of defects in the grown SiC bulk single crystal 15.

Figure 5:
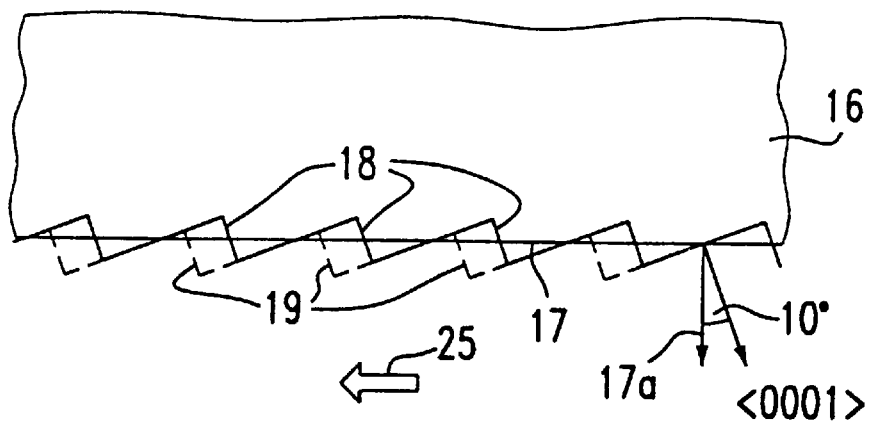
FIG. 5 is a cross sectional view through a misaligned SiC seed crystal.

FIG. 5 shows a cross section through a misaligned SiC seed crystal 16. The surface normal 17a of the misaligned SiC seed crystal 16 is inclined by approximately 10° with respect to the <0001>direction of the basic α-SIC crystal structure. This inclination, which in other exemplary embodiments may even be up to 30°, is known as the misalignment. It leads to the formation of steps 18 on a surface 17. At the start of crystal growth, the initially grown SiC particles 19 preferentially accumulate in the notches of the steps 18. This appears as a step flow, the propagation direction of which is indicated by the arrow 25 in FIG. 5. It has been discovered that, starting from the holder, defects at the edge preferentially grow into the SiC bulk single crystal 15 in the direction of this step flow.

Figure 6:
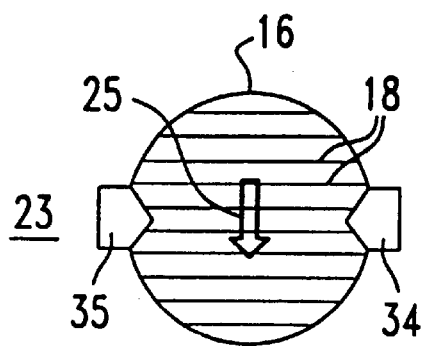
FIG. 6 shows a first embodiment of a seed crystal holder for a misaligned SiC seed crystal.

This defect formation, which starts from the edge, is substantially suppressed by the form of the lateral mount 30 of the seed crystal holder 23 shown in FIG. 6. The misaligned SiC seed crystal 16 is laterally secured using two webs 34 and 35. The two webs 34 and 35 are arranged such that a connecting line between the two webs 34 and 35 is oriented practically parallel to the steps 18, i.e. practically perpendicular to the propagation direction 25 of the step flow. Therefore, however, there is no mechanical holding precisely in the area from which, otherwise, defect growth directed into the SiC crystal preferentially commences. However, this eliminates the essential condition for this type of defect formation, so that it is possible to grow an SiC bulk single crystal 15 with a greatly reduced defect density.

Figure 7:
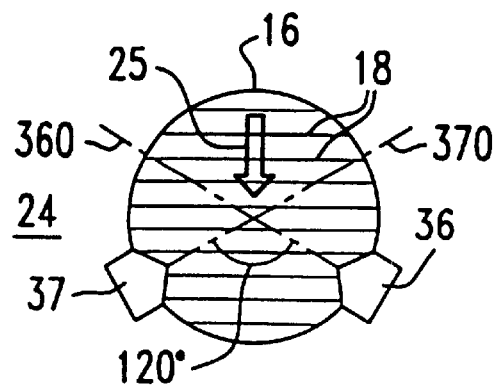
FIG. 7 shows a second embodiment of a seed crystal holder for a misaligned SiC seed crystal.

Another seed crystal holder 24, which is illustrated in FIG. 7, allows the defect density to be reduced further. Two webs 36 and 37 are used to hold the SiC seed crystal 16. Action lines 360 and 370 of these two webs 36 and 37 are at an obtuse angle with respect to each other, which in the example shown in FIG. 7 is approximately 120°.

The seed crystal holders 20 to 24 shown can in principle be used to grow an SiC bulk single crystal 15 of any desired polytype. All of the conventional SiC polytypes, such as for example, 4H—SiC, 6H—SiC or 15R SiC, or even cubic SiC of the 3C—SiC polytype, can be grown using these holders.

We claim:

1. A seed crystal holder for holding a SiC seed crystal inside a crucible while growing a SiC bulk single crystal onto a front surface of the SiC seed crystal, the seed crystal holder, comprising:

a back-surface body having a bearing surface for bearing against a back surface of the SiC seed crystal; and a lateral mount cooperating with said back-surface body;

said lateral mount including at least one projection providing a resting place for an edge region of the front surface of the SiC seed crystal; and said lateral mount having a layer including a material selected from the group consisting of tantalum, tungsten, niobium, molybdenum, rhenium, iridium, ruthenium, hafnium, and zirconium.

2. The seed crystal holder according to claim 1, wherein:

said projection has a thickness and a side that is remote from said bearing surface for the SiC seed crystal; and said side is formed with a first bevel configured such that said thickness of said projection continually decreases towards a center of the SiC seed crystal that will be held.

3. The seed crystal holder according to claim 2, wherein:

said projection has a side that faces the SiC seed crystal; and said side that faces the SiC seed crystal is formed with a second bevel thereby providing an inclined bearing surface for the SiC seed crystal.

4. The seed crystal holder according to claim 1, wherein:

said projection has a side that faces the SiC seed crystal; and said side that faces the SiC seed crystal is formed with a second bevel thereby providing an inclined bearing surface for the SiC seed crystal.

5. The seed crystal holder according to claim 1, wherein said back surface body and said lateral mount are at least substantially made from graphite.

6. The seed crystal holder according to claim 1, wherein said bearing surface is formed by a layer including a material selected from the group consisting of tantalum, tungsten, niobium, molybdenum, rhenium, iridium, ruthenium, hafnium, and zirconium.

7. The seed crystal holder according to claim 1, in combination with the SiC seed crystal, wherein:

said back surface body and the SiC seed crystal have a round cross-sectional area.

8. The seed crystal holder according to claim 1, wherein said lateral mount has a cylindrical form.

9. The seed crystal holder according to claim 1, wherein said lateral mount is designed in a web form.

10. The seed crystal holder according to claim 9, wherein:

said lateral mount includes a first web having a lower end and a second web having a lower end;

said at least one projection includes a first projection and a second projection;

said first projection is configured at said lower end of said first web; and said second projection is configured at said lower end of said first web.

11. The seed crystal holder according to claim 10, in combination with the SiC seed crystal, wherein:

the SiC seed crystal is misaligned and the front surface of the SiC seed crystal is structured in step form along a main step direction;

said first web and said second web are configured along the main step direction; and the SiC seed crystal is positioned between said first web and said second web.

12. The seed crystal holder according to claim 10, in combination with the SiC seed crystal, wherein:

the SiC seed crystal has a center;

said first web defines a first line passing through said first web and the center of the SiC seed crystal;

said second web defines a second line passing through said second web and the center of the SiC seed crystal; and the first line runs at an obtuse angle with respect to the second line.

\* \* \* \* \*